(12) United States Patent
Zou et al.

(10) Patent No.: US 8,552,732 B2
(45) Date of Patent: Oct. 8, 2013

(54) APPARATUS FOR MEASURING CONDUCTIVE PATTERN ON SUBSTRATE

(75) Inventors: Yong-Tong Zou, Taoyuan County (TW); Ding-Kun Liu, Hsinchu County (TW); Hau-Wei Wang, Taipei (TW); Chih-Hsiang Chan, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 391 days.

(21) Appl. No.: 12/981,282

(22) Filed: Dec. 29, 2010

(65) Prior Publication Data

US 2012/0025839 A1 Feb. 2, 2012

(30) Foreign Application Priority Data

Aug. 2, 2010 (TW) .............................. 99125577 A

(51) Int. Cl.
*G01R 31/00* (2006.01)
(52) U.S. Cl.
USPC ...................................... 324/501; 324/754.22
(58) Field of Classification Search
USPC .................. 324/501, 754.21, 754.22, 754.23
See application file for complete search history.

(56) References Cited

U.S. PATENT DOCUMENTS

| | | | |
|---|---|---|---|
| 3,278,679 A * | 10/1966 | Newberry ..................... | 250/271 |
| 5,097,201 A | 3/1992 | Henley | |
| 5,170,127 A | 12/1992 | Henley | |
| 5,504,438 A | 4/1996 | Henley | |
| 7,466,161 B2 | 12/2008 | Gardner et al. | |
| 7,468,611 B2 | 12/2008 | Nguyen et al. | |
| 2004/0145383 A1 * | 7/2004 | Brunner ........................ | 324/756 |

FOREIGN PATENT DOCUMENTS

CN 1963428 A 5/2007

OTHER PUBLICATIONS

China Patent Office, Office Action, Patent Application Serial No. 201010292494.7, Mar. 18, 2013, China.
Jeong Seok Son et al., "Detection of Amorphous-Silicon Residue Generated in Thin-Film Transistor Manufacturing Process Using a High Spectral Response of Amorphous-Silicon Layer on Green Light Source," Current Applied Physics 6, 2006, pp. 84-90, Elsevier, US.
Ying-Moh Liu et al., "Voltage Imaging™ for L-Contact Panel Testing," SPIE vol. 2651, Mar. 1996, pp. 126-129, SPIE, US.
Ying-Moh Liu et al., "Modeling and Analyses of the Voltage Imaging™ Spatial Resolution," SPIE vol. 2182, Image and Video Processing II, 1994, pp. 308-319, SPIE, US.
Ying-Moh Liu et al., "The Optical System Design of the Voltage Image™ Optical Subsystem (VIOS) in AMLCD in Process Test System (IPT)," SPIE vol. 2000, Nov. 1993, pp. 84-95, SPIE, US.

* cited by examiner

*Primary Examiner* — Vincent Q Nguyen

(57) ABSTRACT

An embodiment of the invention provides an apparatus for measuring a conductive pattern on a substrate, which includes a first electro-optical modulator surrounding at least one first detecting roller; transmission rollers for transferring the substrate and allowing direct contact of the substrate and the first electro-optical modulator; a voltage supplier for providing a bias between the first electro-optical modulator and the substrate; and a first image detecting system for receiving a first detecting light reflected from a first surface of the substrate.

26 Claims, 9 Drawing Sheets

APPARATUS FOR MEASURING CONDUCTIVE PATTERN ON SUBSTRATE

CROSS REFERENCE TO RELATED APPLICATIONS

This Application claims priority of Taiwan Patent Application No. 099125577, filed on Aug. 2, 2010, the entirety of which is incorporated by reference herein.

BACKGROUND OF THE INVENTION

1. Field of the Invention

The present invention relates to apparatuses for measuring a conductive pattern on a substrate.

2. Description of the Related Art

Conventional apparatuses for measuring a conductive pattern on a substrate typically contact substrates to be tested by using probes to apply a voltage to the substrates so as to detect the conductive pattern on the substrate, such as short circuits or open circuits etc. Probe card detection apparatuses and probe detection apparatuses are commonly used contact probe electrical detection apparatuses for semiconductor dies and printed circuit boards, respectively. However, with the shrinkage of the process line width, the detection using the conventional probe card detection apparatuses is limited by the detection limits of the physical dimensions of the probes. Further, the cost of a probe card is really high.

On the other hand, with the area of the formed substrate getting larger, speed of detecting needs is getting faster. Specifically, the requirement of whole surface detection is increasing, such as the detection of arrays of display panels, thin film solar cells, touch panels, and flexible displays. The sampling detection method of using probes in contact for measuring electric properties is increasingly becoming more and more unsuitable for the requirement of actual detection.

As mentioned above, the conventional method of measuring electric properties of the to-be-tested substrate by using probes to contact requires a long time. The formed line widths are getting smaller due to the improvement in advanced processing technology, but the sizes which can be detected by the probes are limited and fabrication cost of a probe card is very high. U.S. Pat. Nos. 5,097,201 and 5,170,127 disclose a non-contact type electrical measurement method. An electro-optical modulator such as a polymer dispersed liquid crystal (PDLC) panel or an optical crystal (for example, KDP, KD*P, or ADP) is used. A specific distance (of about 10 μm) is kept between the to-be-tested substrate and the electro-optical modulator, and the to-be-tested substrate and the electro-optical modulator are applied with a positive voltage and a negative voltage respectively so as to form a capacitance and an induced electric field therebetween. The electro-optical modulator is driven by the induced electric filed and the induced voltage image of the electro-optical modulator is recorded by a CCD. The thickness or residual amount of the conducting layer (such as an ITO layer) after a patterning process may be detected by analyzing the variation of the intensity of the gray level of the voltage image to check if the etching of the conducting material in a previous process is complete or if there is any influence on electrical properties of conductive patterns due to surface defects. However, the detecting method of using an electro-optical modulator is limited by the detecting area.

In order to resolve the problems concerning large-area detection and detection efficiency as mentioned above, prior art such as the detecting method disclosed by U.S. Pat. No. 5,504,438 uses a plurality of CCDs to capture images. Then, a following image stitching process is used to increase the detecting area and improve the detection efficiency. However, using a plurality of CCDs will increase fabrication cost. In order to resolve problems concerning increased fabrication costs, U.S. Pat. Nos. 7,466,161 and 7,468,611 disclose a structure using linear CCDs with a gantry apparatus. Through linear scanning, the detecting area is increased and the detection efficiency is improved. However, a specific distance (of about 10 μm) needs to be maintained between the to-be-tested substrate and the electro-optical modulator and the precision of the electrical control and the structure of the scanning apparatus needs to be improved.

BRIEF SUMMARY OF THE INVENTION

An embodiment of the invention provides an apparatus for measuring a conductive pattern on a substrate, which includes: a first electro-optical modulator surrounding at least one first detecting roller; transmission rollers for transferring the substrate and allowing direct contact of the substrate and the first electro-optical modulator; a voltage supplier for providing a bias between the first electro-optical modulator and the substrate; and a first image detecting system for receiving a first detecting light reflected from a first surface of the substrate.

An embodiment of the invention provides an apparatus for measuring a conductive pattern on a substrate, which includes: a first electro-optical modulator surrounding a first detecting roller, wherein the first detecting roller is for transferring the substrate on one side of the first detecting roller and allowing direct contact of the substrate and the first electro-optical modulator; a voltage supplier for providing a bias between the first electro-optical modulator and the substrate; and a first light source system for providing a first detecting light to the substrate, wherein the first light source system is disposed within the first detecting roller such that the first detecting light passes through the first electro-optical modulator and is received by a first image detecting system.

An embodiment of the invention provides an apparatus for measuring a conductive pattern on a substrate, which includes: a first electro-optical modulator surrounding a first detecting roller; a first transmission roller for transferring the substrate on one side of the first transmission roller and allowing direct contact of the substrate and the first electro-optical modulator; a voltage supplier for providing a bias between the first electro-optical modulator and the substrate; and a first light source system for providing a first detecting light to the substrate, wherein the first light source system is disposed within the first transmission roller such that the first detecting light passes through the first electro-optical modulator and is received by a first image detecting system located within the first detecting roller.

An embodiment of the invention provides an apparatus for measuring a conductive pattern on a substrate, which includes: a first electro-optical modulator surrounding a first detecting roller, wherein the first detecting roller is for transferring the substrate on one side of the first detecting roller and allowing direct contact of the substrate and the first electro-optical modulator; a voltage supplier for providing a bias between the first electro-optical modulator and the substrate; and a first light source system for providing a first detecting light to the substrate, wherein the first light source system is disposed on an opposite side of the substrate opposite to the first detecting roller such that the first detecting light passes through the first electro-optical modulator and is received by a first image detecting system located within the first detecting roller.

An embodiment of the invention provides an apparatus for measuring a conductive pattern on a substrate, which includes: a first electro-optical modulator surrounding a first detecting roller; a first transmission roller for transferring the substrate on one side of the first transmission roller and allowing direct contact of the substrate and the first electro-optical modulator; a voltage supplier for providing a bias between the first electro-optical modulator and the substrate; and a first light source system for providing a first detecting light to the substrate, wherein the first light source system is disposed within the first detecting roller such that the first detecting light passes through the first electro-optical modulator and is received by a first image detecting system located within the first transmission roller.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
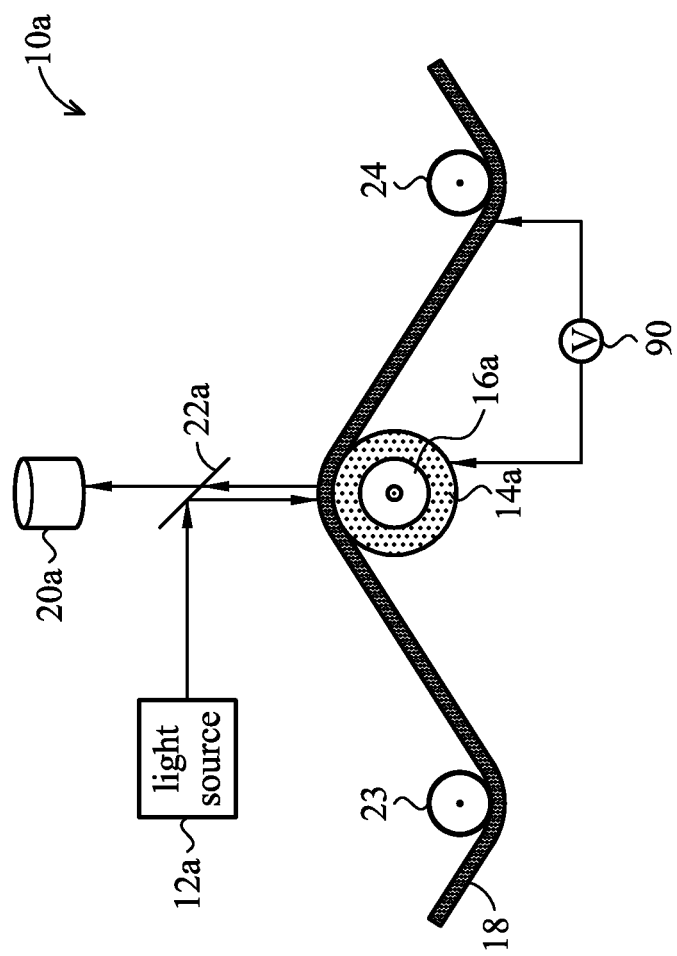
FIG. 1 is a schematic diagram of a reflective type apparatus for measuring a conductive pattern on a substrate according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," or "overlying," (and like descriptions) a second layer, include embodiments where the first and second layers are in direct contact and those where one or more layers are interposing the first and second layers.

Technological characteristics and embodiments of the present invention use an electro-optical modulator covering a roller with functions of transmission gears and sensors, and an image detecting system for receiving an induced voltage image of the electro-optical modulator and analyzing the induced voltage image so as to quickly and large area detect if conductive mediums remain after an etching pattern process or detect the influence of surface defects on electrical properties of a conductive pattern such that the requirements of quick and large-area detection may be satisfied.

In one embodiment, an electrical detection apparatus for measuring a conductive pattern on a large-area substrate includes a light source system; an electro-optical modulator, such as a PDLC panel or an optical crystal, covering a detecting roller; and an image detecting system for recording a voltage image, wherein a transparent conductive medium pattern, such as an ITO pattern, is disposed on the surface of the substrate. The substrate directly contacts the electro-optical modulator covering the detecting roller. Then, a voltage supplier disposed on the roller applies a positive voltage and a negative voltage to the substrate and the electro-optical modulator respectively to form a capacitance and an induced electric field therebetween for driving the electro-optical modulator such that the conductive pattern of the substrate is indirectly revealed on the electro-optical modulator. Then, the image detecting system receives the induced voltage image of the electro-optical modulator and analyzes the induced voltage image to judge if conductive mediums remain after an etching pattern process or electrical properties of a conductive medium pattern are influenced by surface defects, such as influences of open circuits and short circuits.

Measurement Principle

In one embodiment of the present invention, the electrical property measurement principle of a conductive pattern on a substrate to be tested includes: employing a direct contact of an electro-optical modulator, such as KDP, KD*P, ADP, or other suitable optical crystal material, and the substrate or spacing with about 10 μm between the electro-optical modulator and the substrate. By using a voltage supplier, a capacitance between an ITO pattern on the substrate and the electro-optical modulator is formed for forming an induced electric field for driving the electro-optical modulator such that the ITO pattern on the substrate is indirectly revealed on the electro-optical modulator. Then, a light is projected to the electro-optical modulator, and the induced voltage image on the electro-optical modulator is received. The remaining condition of the ITO after an etching pattern process is detected by the intensity of the gray level of the voltage image for determining if the ITO is etched completely by the etching pattern process. As such, defects formed in the process may be detected by the method mentioned above to ensure that the process defects do not electrically affect ITO wires.

The measurement apparatuses are categorized into reflective single-point type, reflective image type, passing-through single-point type and passing-through image type measurement apparatuses. The difference between the reflective type apparatus and the passing-through type apparatus is that the methods of lighting and receiving images are different from each other. The reflective type apparatus uses a beam splitter to project the light generated by a light source system to a subject to be tested and the light reflected by the subject to be tested passes through the beam splitter to the image detecting system such that the measurement result is obtained. Accordingly, the light source system and the image detecting system of the reflective type apparatus are located on the same side of the subject to be tested. The passing-through type apparatus uses a light source system to light the subject to be tested and an image detecting system receives the measurement result on another side of the subject to be tested. The single-point type apparatus measures an average value of an area of the subject to be tested. The image type apparatus has a light source system including a beam expander and an image detecting system including an image lens for observing the surface condition of the subject to be tested. The apparatus and the method for measuring can be adjusted based on requirements and measurement environments.

Types and Fabricating Methods of Electro-Optical Modulators

In the embodiments of the present invention, the material of an electro-optical modulator may include a liquid crystal panel or an optical crystal, such as KDP, KD*P, ADP or other suitable optical crystal materials. Since the response speed of the optical crystal is extremely high, about a nanosecond level, the optical crystal can meet speed requirements corresponding to present process speeds of 3 meters per minute. It should be noted that the optical crystal can be used in a horizontal operation or vertical operation. The horizontal operation refers to that the operating electric field is perpendicular to the incident light. The vertical operation refers to that the operating electric field is parallel to the incident light. Although the embodiments are exemplified by a vertical operation, appreciated, it will be however, a horizontal operation is also feasible for different measuring occasions. The horizontal operation and the vertical operation both use the operating electric field to change the polarization state of the incident light. Specifically, a polarization plate should be disposed before the incidence of the incident light for allowing the passage of the light with a predetermined polarization angle, the electric field in the optical crystal changes the polarization angle of the incident light, and a polarization plate with another polarization angle is disposed in front of a CCD (charge coupled device) for detecting the intensity of the light modulated. The fundamental principle of using a PDLC panel is to use the difference between the indices of refractions of the PDLC and the polymer material doped therein. When not providing a driving voltage, the liquid crystal panel is in the opaque status. When providing a driving voltage, the liquid crystal panel is in the transparent status wherein the index of refraction of the liquid crystal material is similar to that of the polymer material such that required use of polarization devices and special light sources, such as lasers, can be decreased. Further, the production cost of the PDLC panel is low, the production method of the PDLC panel can meet requirements of large-area production, and the largest dimension is 80 cm×75 cm in the present production technology. In addition, the driving voltage of the liquid crystal panel is about 125 volts which is much lower than that of the optical crystal (more than several thousands volts).

Measurement Apparatus

By using the measurement principles and different electro-optical modulators mentioned above, the embodiments described below provide different measurement apparatuses. FIG. 1 is a schematic diagram of a reflective type apparatus for measuring a conductive pattern on a substrate according to an embodiment of the present invention. In FIG. 1, an apparatus 10a for measuring a conductive pattern on a substrate includes an electro-optical modulator 14a disposed on a periphery of a detecting roller 16a. For example, a flexible electro-optical modulator covers the detecting roller. A to-be-tested substrate 18 is transferred between two transmission roller 23 and 24 and contacts the electro-optical modulator 14a. A voltage supplier 90 provides a bias between the electro-optical modulator 14a and the to-be-tested substrate 18. For example, a voltage driving device applies a positive voltage and a negative voltage to the electro-optical modulator and the to-be-tested substrate respectively to form a capacitance between the to-be-tested substrate and the electro-optical modulator and an induced electric field for driving the electro-optical modulator such that the conductive pattern on the to-be-tested substrate is indirectly revealed on the electro-optical modulator. A light source system 12a provides a detecting light to the to-be-tested substrate 18 via a beam splitter 22a wherein the detecting light is received by an image detecting system 20a (such as CCD) after being reflected. An image detecting system receives an induced voltage image revealed on the electro-optical modulator and analyzes the induced voltage image to judge if conductive mediums remain after an etching pattern process, or detect the influence of surface defects on electrical properties of a conductive medium pattern.

Figure 2:
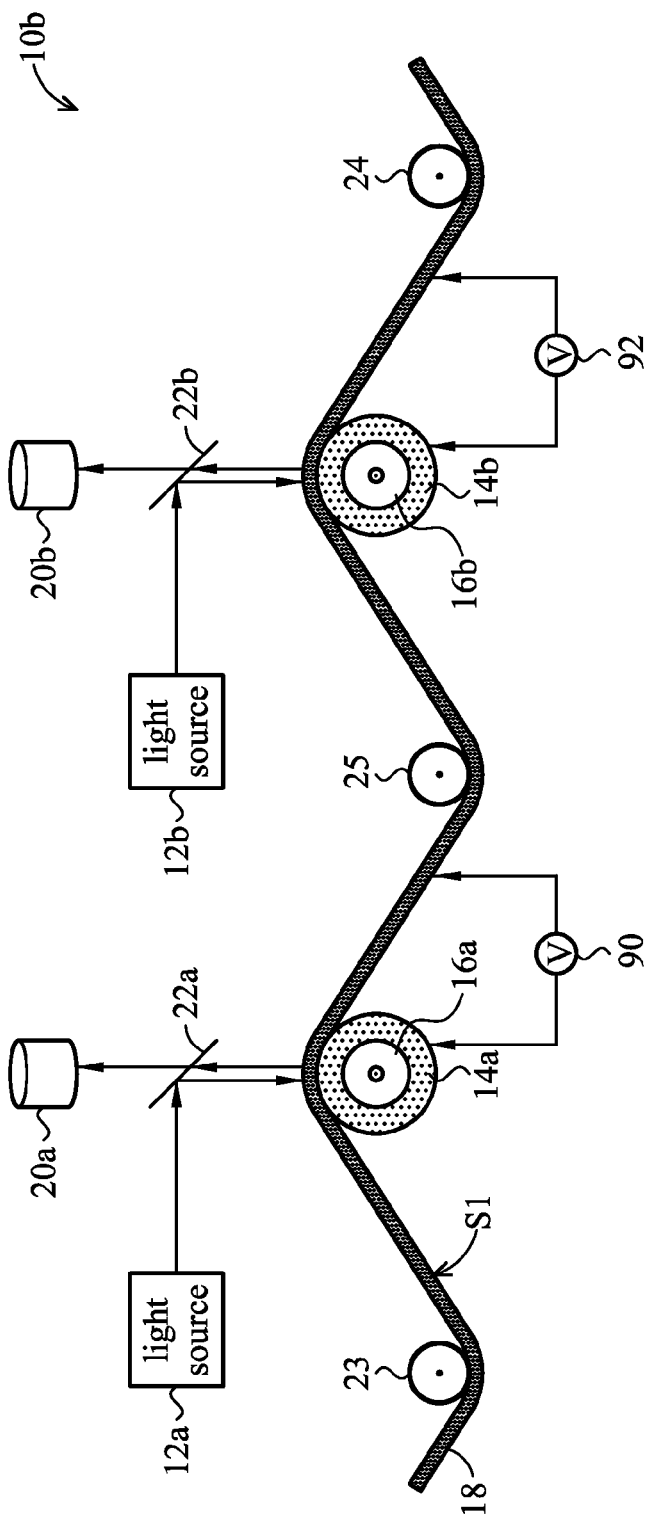
FIG. 2 is a schematic diagram of a reflective type apparatus for measuring a conductive pattern on a substrate according to another embodiment of the present invention.
Figure 4:
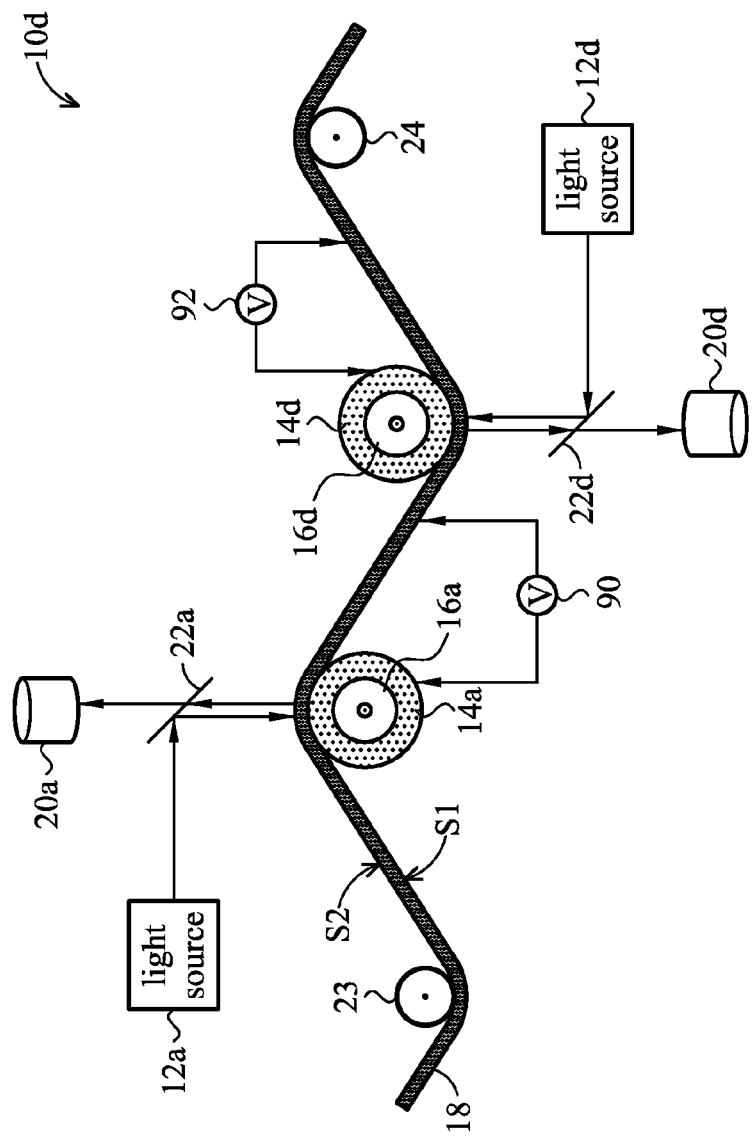
FIG. 4 is a schematic diagram of a double-sided reflective type apparatus for measuring a conductive pattern on a substrate according to an embodiment of the present invention.

In another embodiment, because of the high speed of the roller-rolling tape process, two or more sets of detecting rollers and image detecting systems can be used to perform segmental detection to reduce the quantity of the direct processing image data of each image detecting system, so that an inexpensive low-speed image detecting module can be obtained to reduce the cost of hardware. For example, as shown in FIG. 2, an apparatus 10b for measuring a conductive pattern on a substrate includes a second electro-optical modulator 14b disposed on a periphery of a second detecting roller 16b, a second voltage supplier 92 providing a bias between the second electro-optical modulator 14b and a to-be-tested substrate 18, and a second light source system 12b providing a second detecting light to the to-be-tested substrate 18 via a second beam splitter 22b wherein the second detecting light is received by an second image detecting system 20b after being reflected by a first surface S1 of the to-be-tested substrate 18. In another embodiment, as shown in FIG. 4, an apparatus 10d for measuring a conductive pattern on a substrate further includes a second electro-optical modulator 14d disposed on a periphery of a second detecting roller 16d wherein the first electro-optical modulator 14a and the second electro-optical modulator 14d are respectively disposed on opposite sides of the to-be-tested substrate 18 for measuring electric properties of the patterned conductive layers on the opposite sides of the to-be-tested substrate 18, a second voltage supplier 92 providing a bias between the second electro-optical modulator 14*d* and the to-be-tested substrate 18, and a second light source system 12*d* providing a second detecting light to a second surface S2 of the to-be-tested substrate 18 via a beam splitter 22*d* wherein the second detecting light is received by an second image detecting system 20*d* after being reflected by a second surface S2 of the to-be-tested substrate 18.

Figure 3:
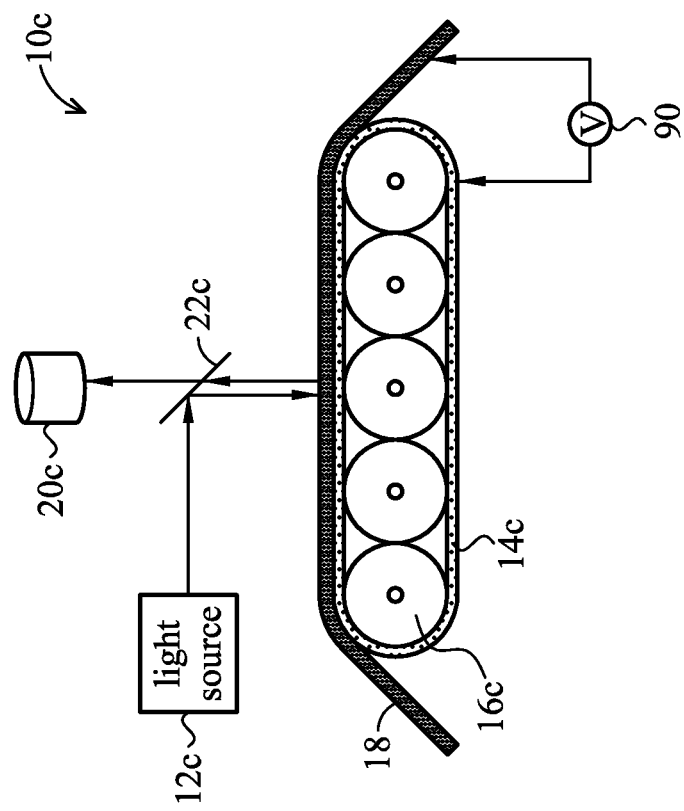
FIG. 3 is a schematic diagram of a reflective type apparatus for measuring a conductive pattern on a substrate according to still another embodiment of the present invention.

FIG. 3 is a schematic diagram of a reflective type apparatus for measuring a conductive pattern on a substrate according to still another embodiment of the present invention. In FIG. 3, an apparatus 10*c* for measuring a conductive pattern on a substrate includes a track type electro-optical modulator 14*c* surrounding peripheries of detecting rollers 16*c*. A to-be-tested substrate 18 is transferred on the track type electro-optical modulator 14*c* and contacts the track type electro-optical modulator 14*c*. A voltage supplier 90 provides a bias between the track type electro-optical modulator 14*c* and the to-be-tested substrate 18. A light source system 12*c* provides a detecting light to the to-be-tested substrate 18 via a beam splitter 22*c* wherein the detecting light is received by an image detecting system 20*c*, such as CCD, after being reflected.

Figure 5:
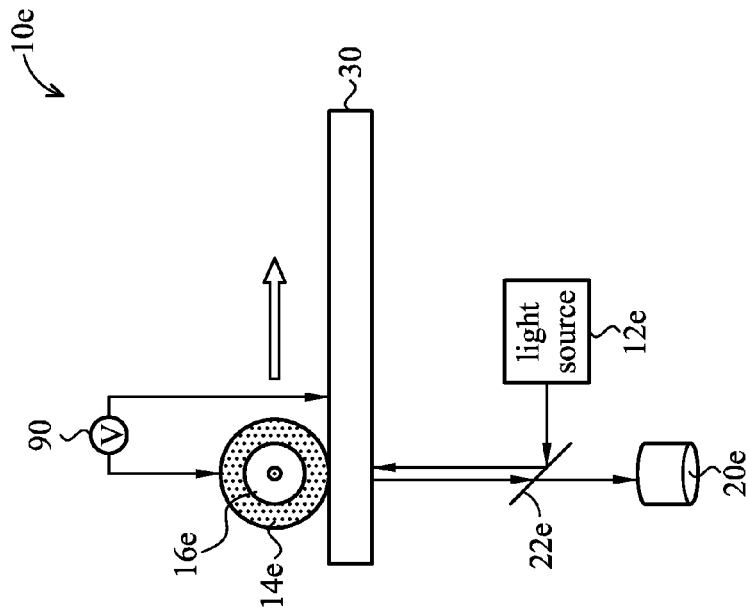
FIG. 5 is a schematic diagram of a reflective type apparatus for measuring a conductive pattern on a substrate according to an embodiment of the present invention.

FIG. 5 is a schematic diagram of a reflective type apparatus for measuring a conductive pattern on a substrate according to an embodiment of the present invention. In FIG. 5, an apparatus 10*e* for measuring a conductive pattern on a substrate includes an electro-optical modulator 14*e* disposed on a periphery of a detecting roller 16*e*. A rigid to-be-tested substrate 30 contacts the electro-optical modulator 14*e*. A voltage supplier 90 provides a bias between the electro-optical modulator 14*e* and the rigid to-be-tested substrate 30. A light source system 12*e* provides a detecting light to the rigid to-be-tested substrate 30 via a beam splitter 22*e* wherein the detecting light is received by an image detecting system 20*e* after being reflected.

Figure 6:
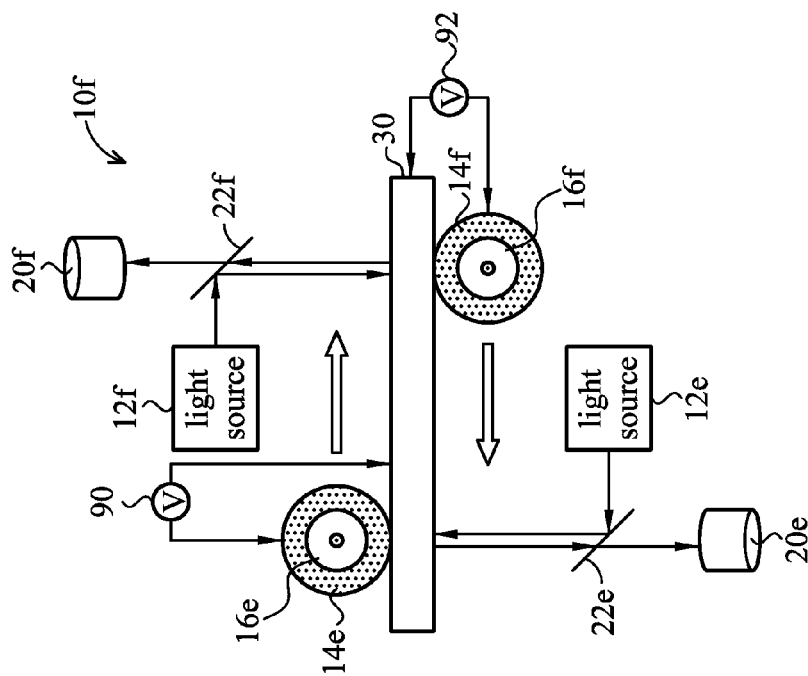
FIG. 6 is a schematic diagram of a double-sided reflective type apparatus for measuring a conductive pattern on a substrate according to another embodiment of the present invention.

In another embodiment, because the speed of the roller-rolling tape process is high, two sets or multiple sets of detecting rollers and image detecting systems can be used to perform segmental detection to decrease the direct processing image data quantity of each image detecting system, so that an expensive high-speed image detecting module can be replaced with a cheap low-speed image detecting module for decreasing the cost of hardware. For example, as shown in FIG. 6, an apparatus 10*f* for measuring a conductive pattern on a substrate further includes a second electro-optical modulator 14*f* disposed on a periphery of a second detecting roller 16*f* wherein the first electro-optical modulator 14*e* and the second electro-optical modulator 14*f* are respectively disposed on opposite sides of a rigid to-be-tested substrate 30 for measuring electric properties of the patterned conductive layers on the opposite sides of the to-be-tested substrate 30. A second voltage supplier 92 provides a bias between the second electro-optical modulator 14*f* and the rigid to-be-tested substrate 30. A second light source system 12*f* provides a detecting light to the rigid to-be-tested substrate 30 via a beam splitter 22*f* wherein the detecting light is received by an second image detecting system 20*f* after being reflected.

Figure 7:
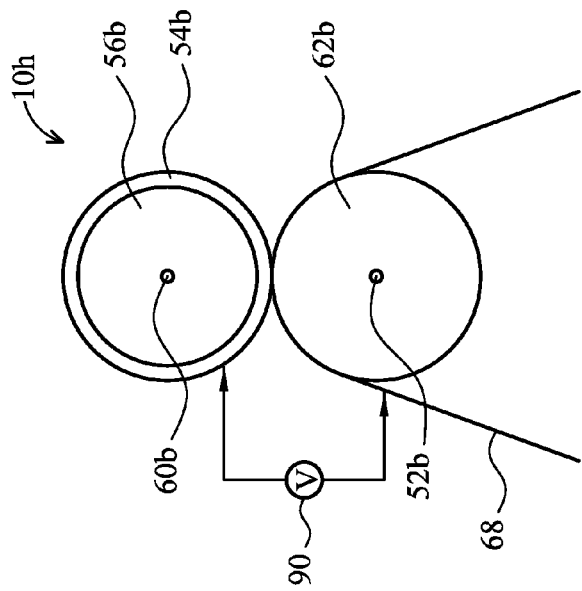
FIG. 7 is a schematic diagram of a passing-through type apparatus for measuring a conductive pattern on a substrate according to an embodiment of the present invention.

FIG. 7 is a schematic diagram of a passing-through type apparatus for measuring a conductive pattern on a substrate according to an embodiment of the present invention. In FIG. 7, an apparatus 10*g* for measuring a conductive pattern on a substrate includes an electro-optical modulator 54*a* disposed on a periphery of a transparent detecting roller 56*a*. For example, a flexible electro-optical modulator covers the transparent detecting roller 56*a*. A to-be-tested substrate 68 is transferred on one side of the transparent detecting roller 56*a* and contacts the electro-optical modulator 54*a*. A voltage supplier 90 provides a bias between the electro-optical modulator 54*a* and the to-be-tested substrate 68. For example, a voltage driving device applies a positive voltage and a negative voltage to the electro-optical modulator and the to-be-tested substrate respectively to form a capacitance between the to-be-tested substrate and the electro-optical modulator and an induced electric field for driving the electro-optical modulator such that the conductive pattern on the to-be-tested substrate is indirectly revealed on the electro-optical modulator. A light source system 52*a* disposed within the transparent detecting roller 56*a* provides a detecting light which passes through the detecting roller 56*a* and the to-be-tested substrate 68 and is received by an image detecting system 60*a* (such as CCD). It should be noted that, in another embodiment, the locations of the light source system 52*a* and the image detecting system 60*a* can be exchanged with each other.

Figure 8:
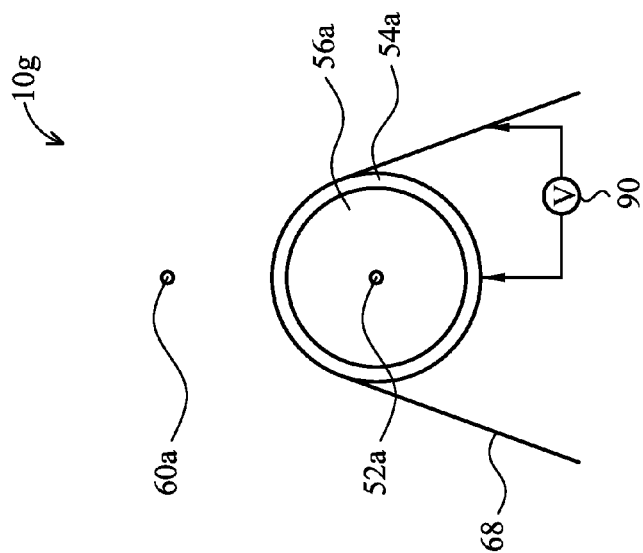
FIG. 8 is a schematic diagram of a passing-through type apparatus for measuring a conductive pattern on a substrate according to another embodiment of the present invention.

FIG. 8 is a schematic diagram of a passing-through type apparatus for measuring a conductive pattern on a substrate according to another embodiment of the present invention. In FIG. 8, an apparatus 10*h* for measuring a conductive pattern on a substrate includes an electro-optical modulator 54*b* disposed on a periphery of a transparent detecting roller 56*b*. A to-be-tested substrate 68 is transferred on a periphery of a transparent transmission roller 62*b* and contacts the electro-optical modulator 54*b*. A voltage supplier 90 provides a bias between the electro-optical modulator 54*b* and the to-be-tested substrate 68. A light source system 52*b* disposed within the transparent transmission roller 62*b* provides a detecting light which passes through the transmission roller 62*b*, the to-be-tested substrate 68 and the transparent detecting roller 56*b* and is received by an image detecting system 60*b* (such as CCD) within the transparent detecting roller 56*b*. It should be noted that, in another embodiment, the locations of the light source system 52*b* and the image detecting system 60*b* can be exchanged with each other.

Figure 9:
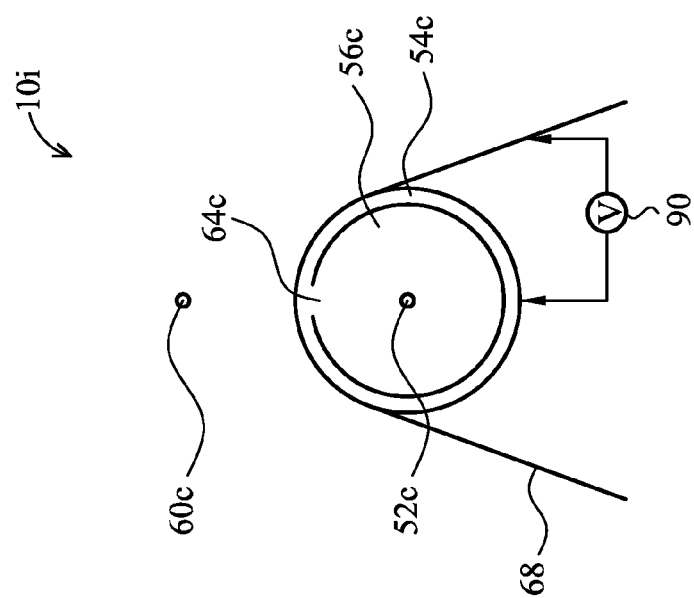
FIG. 9 is a schematic diagram of a passing-through type apparatus for measuring a conductive pattern on a substrate according to still another embodiment of the present invention.

FIG. 9 is a schematic diagram of a passing-through type apparatus for measuring a conductive pattern on a substrate according to still another embodiment of the present invention. In FIG. 9, an apparatus 10*i* for measuring a conductive pattern on a substrate includes an electro-optical modulator 54*c* disposed on a periphery of an opaque detecting roller 56*c* having an opening 64*c*. A to-be-tested substrate 68 is transferred on one side of the opaque detecting roller 56*c* and contacts the electro-optical modulator 54*c*. A voltage supplier 90 provides a bias between the electro-optical modulator 54*c* and the to-be-tested substrate 68. A light source system 52*c* disposed within the transparent detecting roller 56*c* provides a detecting light which passes through the detecting roller 56*c* and the to-be-tested substrate 68 and is received by an image detecting system 60*c* (such as CCD) through the opening 64*c*. It should be noted that, in another embodiment, the locations of the light source system 52*c* and the image detecting system 60*c* can be exchanged with each other.

Figure 10:
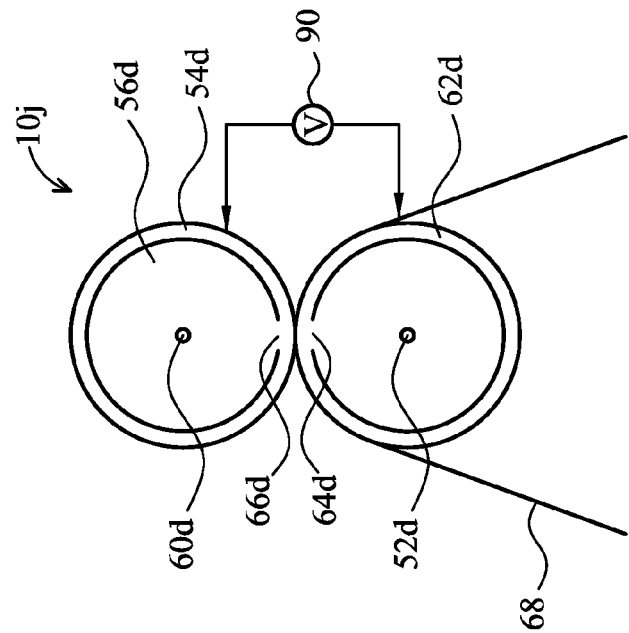
FIG. 10 is a schematic diagram of a passing-through type apparatus for measuring a conductive pattern on a substrate according to an embodiment of the present invention.

FIG. 10 is a schematic diagram of a passing-through type apparatus for measuring a conductive pattern on a substrate according to an embodiment of the present invention. In FIG. 10, an apparatus 10*j* for measuring a conductive pattern on a substrate includes an electro-optical modulator 54*d* disposed on a periphery of an opaque detecting roller 56*d*. A to-be-tested substrate 68 is transferred on one side of an opaque transmission roller 62*d* and contacts the electro-optical modulator 54*d*. It should be noted that, the detecting roller 56*d* and the transmission roller 62*d* both are opaque and each has an opening such that the detecting light passes through the electro-optical modulator and is received by an image detecting system. A voltage supplier 90 provides a bias between the electro-optical modulator 50a and the to-be-tested substrate 68. A light source system 52d disposed within the opaque transmission roller 62d provides a detecting light which passes through the transmission roller 62d, the to-be-tested substrate 68 and the detecting roller 56d through openings 64d and 66d and is received by an image detecting system 60d within the transparent detecting roller 56d. It should be noted that, in another embodiment, the locations of the light source system 52d and the image detecting system 60d can be exchanged with each other.

Figure 11:
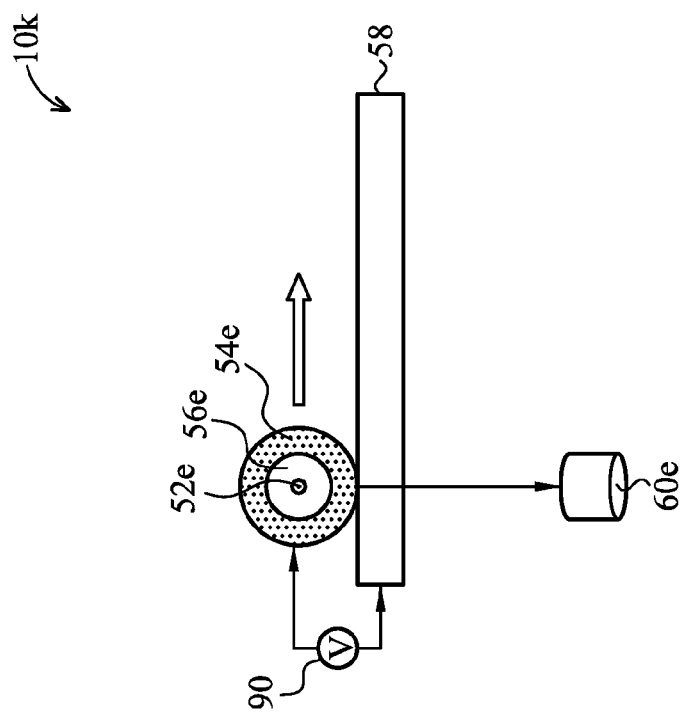
FIG. 11 is a schematic diagram of a passing-through type apparatus for measuring a conductive pattern on a substrate according to another embodiment of the present invention.

FIG. 11 is a schematic diagram of a passing-through type apparatus for measuring a conductive pattern on a substrate according to another embodiment of the present invention. In FIG. 11, an apparatus 10k for measuring a conductive pattern on a substrate includes an electro-optical modulator 54e disposed on a periphery of a detecting roller 56e. A rigid to-be-tested substrate 58 contacts the electro-optical modulator 54e. A voltage supplier 90 provides a bias between the electro-optical modulator 54e and the rigid to-be-tested substrate 58. A light source system 52e disposed within the transparent detecting roller 56e provides a detecting light which passes through the detecting roller 56e and the to-be-tested substrate 58 and is received by an image detecting system 60e. It should be noted that, in another embodiment, the locations of the light source system 52e and the image detecting system 60e can be exchanged with each other.

Figure 12:
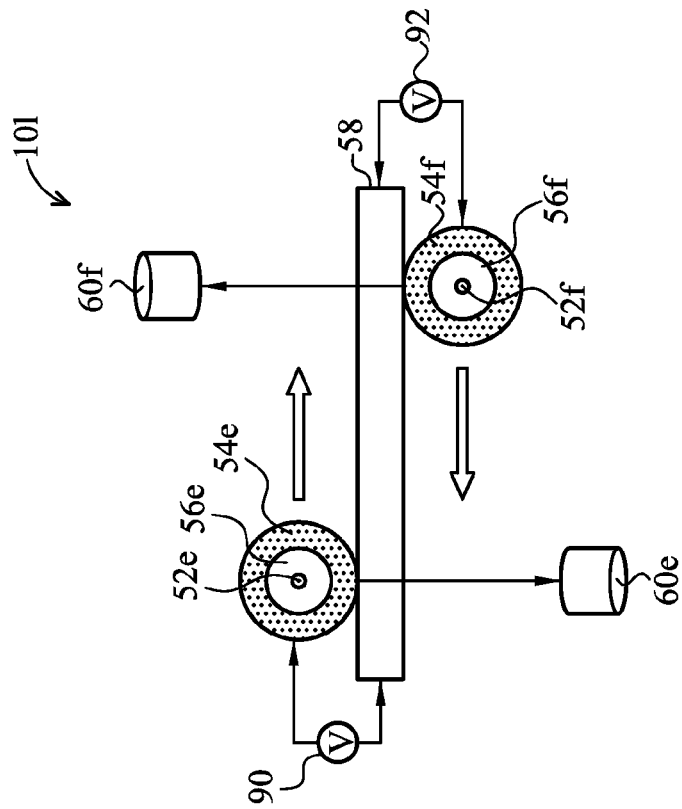
FIG. 12 is a schematic diagram of a double-sided passing-through type apparatus for measuring a conductive pattern on a substrate according to an embodiment of the present invention.

In another embodiment, because the speed of the roller-rolling tape process is high, two sets or multiple sets of detecting rollers and image detecting systems can be used to perform segmental detection to decrease the direct processing image data quantity of each image detecting system, so that an expensive high-speed image detecting module can be replaced with a cheap low-speed image detecting module for decreasing the cost of hardware. For example, as shown in FIG. 12, an apparatus 10l for measuring a conductive pattern on a substrate further includes a second electro-optical modulator 54f disposed on a periphery of a second detecting roller 56f wherein the first electro-optical modulator 54e and the second electro-optical modulator 54f are respectively disposed on opposite sides of a rigid to-be-tested substrate 58 for measuring electric properties of the patterned conductive layers on the opposite sides of the to-be-tested substrate. A second voltage supplier 92 provides a bias between the second electro-optical modulator 54f and the rigid to-be-tested substrate 58. A second light source system 52f within the second detecting roller 56f provides a detecting light which passes through the second detecting roller 56f and the rigid to-be-tested substrate 58 and is received by an image detecting system 60f. It should be noted that, in another embodiment, the locations of the second light source system 52f and the second image detecting system 60f can be exchanged with each other.

Figure 13:
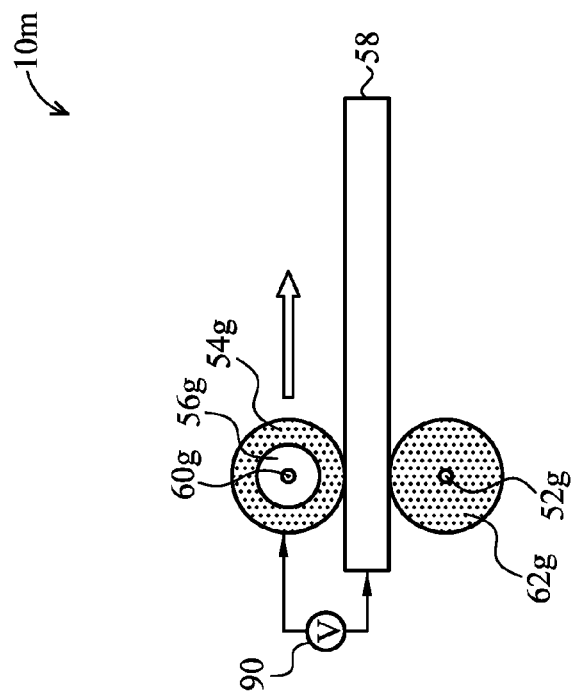
FIG. 13 is a schematic diagram of a passing-through type apparatus for measuring a conductive pattern on a substrate according to an embodiment of the present invention.

FIG. 13 is a schematic diagram of a passing-through type apparatus for measuring a conductive pattern on a substrate according to an embodiment of the present invention. In FIG. 13, an apparatus 10m for measuring a conductive pattern on a substrate includes an electro-optical modulator 54g disposed on a periphery of a transparent detecting roller 56g. A rigid to-be-tested substrate 58 is transferred on a periphery of a transparent transmission roller 62g and contacts the electro-optical modulator 54g. A voltage supplier 90 provides a bias between the electro-optical modulator 54g and the rigid to-be-tested substrate 58. A light source system 52g disposed within the transparent transmission roller 62g provides a detecting light which passes through the transmission roller 62g, the rigid to-be-tested substrate 58 and the transparent detecting roller 56g and is received by an image detecting system 60g (such as CCD) within the transparent detecting roller 56g. It should be noted that, in another embodiment, the locations of the light source system 52g and the image detecting system 60g can be exchanged with each other.

Figure 14:
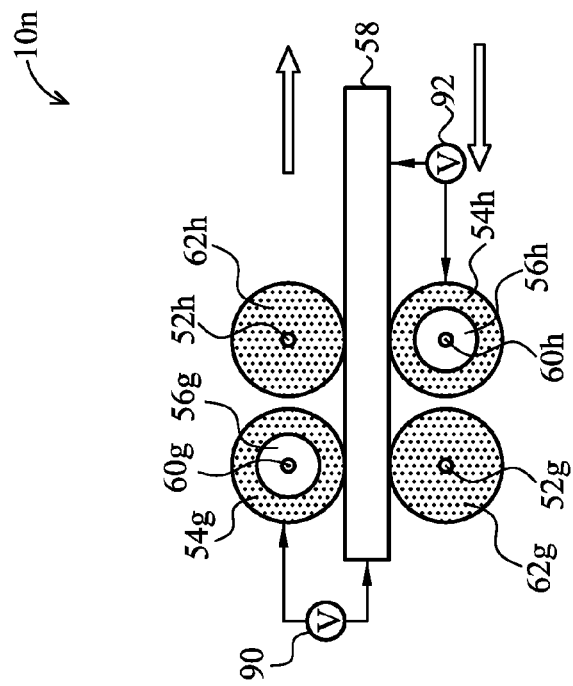
FIG. 14 is a schematic diagram of a double-sided passing-through type apparatus for measuring a conductive pattern on a substrate according to an embodiment of the present invention.

In another embodiment, two sets or multiple sets of detecting rollers and image detecting systems can be used to perform segmental detection to decrease the direct processing image data quantity of each image detecting system, so that an expensive high-speed image detecting module can be replaced with a cheap low-speed image detecting module. For example, as shown in FIG. 14, an apparatus 10n for measuring a conductive pattern on a substrate further includes a second electro-optical modulator 54h disposed on a periphery of a second detecting roller 56h wherein the first electro-optical modulator 54g and the second electro-optical modulator 54h are respectively disposed on opposite sides of a rigid to-be-tested substrate 58 for measuring electric properties of the patterned conductive layers on the opposite sides of the to-be-tested substrate. The rigid to-be-tested substrate 58 is transferred on a periphery of a second transmission roller 62h and contacts the second electro-optical modulator 54h. A second voltage supplier 92 provides a bias between the second electro-optical modulator 54h and the rigid to-be-tested substrate 58. A second light source system 52h within the second transmission roller 62h provides a detecting light which passes through the second detecting roller 56h and the rigid to-be-tested substrate 58 and is received by an image detecting system 60h. It should be noted that, in another embodiment, the locations of the second light source system 52h and the second image detecting system 60h can be exchanged with each other.

In the embodiments described above, the to-be-tested substrate directly contacts the electro-optical modulator such that the detecting speed is not limited by the difficulty of the electrical control. Further, the electro-optical modulator can be a PDLC flexible panel that allows large-area production to perform large-area detection and the manufacturing cost thereof is really low. The requirement of roll-to-roll large-area quick detection of the etched ITO circuit and the residual quantity after an etching pattern process can be met by amending the present tape machine with the 2D image detecting technology which is well developed recently.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for measuring a conductive pattern on a substrate, comprising:
    a first electro-optical modulator surrounding at least one first detecting roller;
    transmission rollers for transferring the substrate and allowing direct contact of the substrate and the first electro-optical modulator;
    a voltage supplier for providing a bias between the first electro-optical modulator and the substrate; and
    a first image detecting system for receiving a first detecting light reflected from a first surface of the substrate.

2. The apparatus as claimed in claim 1, further comprising:
    a second electro-optical modulator surrounding a second detecting roller;

a second voltage supplier for providing a bias between the second electro-optical modulator and the substrate; and a second image detecting system for receiving a second detecting light reflected from the first surface of the substrate.

3. The apparatus as claimed in claim 1, wherein the first electro-optical modulator is a track surrounding and covering a periphery of the at least one first detecting roller.

4. The apparatus as claimed in claim 1, further comprising:

a second electro-optical modulator surrounding a second detecting roller, wherein the first electro-optical modulator and the second electro-optical modulator are disposed on opposite sides of the substrate respectively;

a second voltage supplier for providing a bias between the second electro-optical modulator and the substrate; and a second image detecting system for receiving a second detecting light reflected from a second surface of the substrate.

5. An apparatus for measuring a conductive pattern on a substrate, comprising:

a first electro-optical modulator surrounding a first detecting roller, wherein the first detecting roller is for transferring the substrate on one side of the first detecting roller and allowing direct contact of the substrate and the first electro-optical modulator;

a voltage supplier for providing a bias between the first electro-optical modulator and the substrate; and a first light source system for providing a first detecting light to the substrate, wherein the first light source system is disposed within the first detecting roller such that the first detecting light passes through the first electro-optical modulator and is received by a first image detecting system.

6. The apparatus as claimed in claim 5, further comprising:

a second electro-optical modulator surrounding a second detecting roller, wherein the first electro-optical modulator and the second electro-optical modulator are disposed on opposite sides of the substrate respectively;

a second voltage supplier for providing a bias between the second electro-optical modulator and the substrate; and a second light source system for providing a second detecting light to the substrate, wherein the second light source system is disposed within the second detecting roller such that the second detecting light passes through the second electro-optical modulator and is received by a second image detecting system.

7. The apparatus as claimed in claims 6, wherein the first electro-optical modulator and the second electro-optical modulator are both flexible electro-optical modulators and surround and cover peripheries of the first detecting roller and the second detecting roller respectively.

8. The apparatus as claimed in claims 6, wherein at least one set of the detecting rollers are transparent detecting rollers for the detecting light to pass through the electro-optical modulators and be received by the image detecting systems.

9. The apparatus as claimed in claims 6, wherein at least one set of the detecting rollers are opaque detecting rollers with openings for the detecting light to pass through the electro-optical modulators and be received by the image detecting systems.

10. The apparatus as claimed in claims 6, wherein at least one of the detecting rollers is a transparent detecting roller for the detecting light to pass through the electro-optical modulators and be received by the image detecting systems.

11. The apparatus as claimed in claims 6, wherein at least one of the detecting rollers is an opaque detecting roller having an opening for the detecting light to pass through the electro-optical modulators and be received by the image detecting systems.

12. An apparatus for measuring a conductive pattern on a substrate, comprising:

a first electro-optical modulator surrounding a first detecting roller;

a first transmission roller for transferring the substrate on one side of the first transmission roller and allowing direct contact of the substrate and the first electro-optical modulator;

a voltage supplier for providing a bias between the first electro-optical modulator and the substrate; and a first light source system for providing a first detecting light to the substrate, wherein the first light source system is disposed within the first transmission roller such that the first detecting light passes through the first electro-optical modulator and is received by a first image detecting system located within the first detecting roller.

13. The apparatus as claimed in claim 12, further comprising:

a second electro-optical modulator surrounding a second detecting roller, wherein the first electro-optical modulator and the second electro-optical modulator are disposed on opposite sides of the substrate respectively;

a second voltage supplier for providing a bias between the second electro-optical modulator and the substrate; and a second light source system for providing a second detecting light to the substrate, wherein the second light source system is disposed within the second transmission roller such that the second detecting light passes through the second electro-optical modulator and is received by a second image detecting system located within the second detecting roller.

14. The apparatus as claimed in claims 13, wherein the first electro-optical modulator and the second electro-optical modulator are both flexible electro-optical modulators and surround and cover peripheries of the first detecting roller and the second detecting roller respectively.

15. The apparatus as claimed in claims 13, wherein at least one set of the detecting rollers are transparent detecting rollers for the detecting light to pass through the electro-optical modulators and be received by the image detecting systems.

16. The apparatus as claimed in claims 13, wherein at least one set of the detecting rollers are opaque detecting rollers with openings for the detecting light to pass through the electro-optical modulators and be received by the image detecting systems.

17. An apparatus for measuring a conductive pattern on a substrate, comprising:

a first electro-optical modulator surrounding a first detecting roller, wherein the first detecting roller is for transferring the substrate on one side of the first detecting roller and allowing direct contact of the substrate and the first electro-optical modulator;

a voltage supplier for providing a bias between the first electro-optical modulator and the substrate; and a first light source system for providing a first detecting light to the substrate, wherein the first light source system is disposed on an opposite side of the substrate opposite to the first detecting roller such that the first detecting light passes through the first electro-optical modulator and is received by a first image detecting system located within the first detecting roller.

18. The apparatus as claimed in claim 17, further comprising:
- a second electro-optical modulator surrounding a second detecting roller, wherein the first electro-optical modulator and the second electro-optical modulator are disposed on opposite sides of the substrate respectively;
- a second voltage supplier for providing a bias between the second electro-optical modulator and the substrate; and
- a second light source system for providing a second detecting light to the substrate, wherein the second light source system is disposed on another opposite side of the substrate opposite to the second detecting roller such that the second detecting light passes through the second electro-optical modulator and is received by a second image detecting system located within the second detecting roller.

19. The apparatus as claimed in claims 18, wherein the first electro-optical modulator and the second electro-optical modulator are both flexible electro-optical modulators and surround and cover peripheries of the first detecting roller and the second detecting roller respectively.

20. The apparatus as claimed in claims 18, wherein at least one set of the detecting rollers are transparent detecting rollers for the detecting light to pass through the electro-optical modulators and be received by the image detecting systems.

21. The apparatus as claimed in claims 18, wherein at least one set of the detecting rollers are opaque detecting rollers with openings for the detecting light to pass through the electro-optical modulators and be received by the image detecting systems.

22. An apparatus for measuring a conductive pattern on a substrate, comprising:
- a first electro-optical modulator surrounding a first detecting roller;
- a first transmission roller for transferring the substrate on one side of the first transmission roller and allowing direct contact of the substrate and the first electro-optical modulator;
- a voltage supplier for providing a bias between the first electro-optical modulator and the substrate; and
- a first light source system for providing a first detecting light to the substrate, wherein the first light source system is disposed within the first detecting roller such that the first detecting light passes through the first electro-optical modulator and is received by a first image detecting system located within the first transmission roller.

23. The apparatus as claimed in claim 22, further comprising:
- a second electro-optical modulator surrounding a second detecting roller, wherein the first electro-optical modulator and the second electro-optical modulator are disposed on opposite sides of the substrate respectively;
- a second voltage supplier for providing a bias between the second electro-optical modulator and the substrate; and
- a second light source system for providing a second detecting light to the substrate, wherein the second light source system is disposed within the second detecting roller such that the second detecting light passes through the second electro-optical modulator and is received by a second image detecting system located within a second transmission roller.

24. The apparatus as claimed in claims 23, wherein the first electro-optical modulator and the second electro-optical modulator are both flexible electro-optical modulators and surround and cover peripheries of the first detecting roller and the second detecting roller respectively.

25. The apparatus as claimed in claims 23, wherein at least one set of the detecting rollers are transparent detecting rollers for the detecting light to pass through the electro-optical modulators and be received by the image detecting systems.

26. The apparatus as claimed in claims 23, wherein at least one set of the detecting rollers are opaque detecting rollers with openings for the detecting light to pass through the electro-optical modulators and be received by the image detecting systems.

* * * * *